US011424676B2

(12) United States Patent
Rana et al.

(10) Patent No.: US 11,424,676 B2
(45) Date of Patent: Aug. 23, 2022

(54) POSITIVE AND NEGATIVE CHARGE PUMP CONTROL

(71) Applicants: STMicroelectronics International N.V., Geneva (CH); STMicroelectronics S.r.l., Agrate Brianza (IT)

(72) Inventors: Vikas Rana, Noida (IN); Marco Pasotti, Travaco'Siccomario (IT); Fabio De Santis, Milan (IT)

(73) Assignees: STMicroelectronics International N.V., Geneva (CH); STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/145,107

(22) Filed: Jan. 8, 2021

(65) Prior Publication Data
US 2021/0234460 A1    Jul. 29, 2021

Related U.S. Application Data

(60) Provisional application No. 62/965,617, filed on Jan. 24, 2020.

(51) Int. Cl.
*H02M 3/07*        (2006.01)
*G11C 5/14*        (2006.01)

(52) U.S. Cl.
CPC ............... *H02M 3/07* (2013.01); *G11C 5/145* (2013.01); *H02M 3/071* (2021.05)

(58) Field of Classification Search
CPC .............................. H02M 3/078; G11C 5/146
See application file for complete search history.

(56) References Cited

U.S. PATENT DOCUMENTS

| | | | | |
|---|---|---|---|---|
| 5,396,114 A | * | 3/1995 | Lee | G05F 3/205 323/313 |
| 5,889,664 A | * | 3/1999 | Oh | H02M 3/073 363/60 |
| 6,118,329 A | | 9/2000 | Jin | |
| 7,362,164 B2 | * | 4/2008 | Kang | G11C 5/145 327/536 |
| 7,427,889 B2 | * | 9/2008 | Lin | H02M 3/07 327/536 |
| 7,855,933 B2 | | 12/2010 | Song et al. | |
| 8,058,853 B2 | * | 11/2011 | Murota | H02M 3/158 323/267 |

(Continued)

OTHER PUBLICATIONS

Ballo et al., "A Review of Charge Pump Togologies for the Power Management of IoT Nodes," *Electronics* 8:480, 2019. (15 pages).

(Continued)

*Primary Examiner* — Thomas J. Hiltunen
(74) *Attorney, Agent, or Firm* — Seed IP Law Group LLP

(57) ABSTRACT

A voltage supply circuit and a method for controlling a voltage supply circuit are provided. The voltage supply circuit includes a positive charge pump stage that generates a positive voltage and a negative charge pump stage that generates a negative voltage. The voltage supply circuit also includes a control stage that compares a voltage representative of the negative voltage with a reference voltage and causes a slope of the positive voltage to decrease when the voltage representative of the negative voltage exceeds the reference voltage.

12 Claims, 10 Drawing Sheets

(56) References Cited

U.S. PATENT DOCUMENTS

| | | | |
|---|---|---|---|
| 8,493,133 B2* | 7/2013 | Byeon | G05F 1/575 |
| | | | 327/536 |
| 8,779,845 B2* | 7/2014 | Kim | H02M 3/07 |
| | | | 327/536 |
| 9,323,276 B2* | 4/2016 | Im | G05F 5/00 |
| 2006/0132417 A1 | 6/2006 | Shigenobu et al. | |
| 2017/0338069 A1 | 11/2017 | Reinhold et al. | |
| 2017/0338823 A1 | 11/2017 | Reinhold et al. | |

OTHER PUBLICATIONS

Palumbo et al., "Charge Pump Circuits: An Overview on Design Strategies and Topologies," *IEEE Circuits and Systems Magazine*, First Quarter 2010, pp. 31-45, 2010.

\* cited by examiner

POSITIVE AND NEGATIVE CHARGE PUMP CONTROL

BACKGROUND

Technical Field

This application is directed to controlling a voltage supply circuit and, in particular, controlling the voltage supply circuit to mitigate drift or gravitation of generated positive and negative voltages respectively generated by positive and negative charge pumps towards each other.

Description of the Related Art

In conventional systems, positive and negative charge pumps are used to generate respective positive and negative voltages. The charge pumps are independently operated to generate the respective positive and negative voltages. The charge pump may supply the positive voltage and the negative voltage to a circuit, such as a memory that stores data. When the charge pumps supply voltages to voltage lines that are in close proximity to each other or densely populated, parasitic capacitances may emerge between the voltage lines causing the positive voltage to pull the negative voltage and vice-versa. The voltages may drift towards each other particularly during a transient ramp up stage in which the positive voltage increases (or ramps up) from a zero or supply voltage value to a positive voltage value and the negative voltage decreases (or ramps down) from a zero value to a negative voltage value. This in turn reduces the fidelity of the generated voltages.

BRIEF SUMMARY

To counter the drift or gravitation, a voltage supply circuit is provided with a control stage that uses the negative voltage to control the positive voltage and/or vice versa. In particular, the control stage compares the negative voltage (or a voltage representative thereof) to a reference voltage, which may be ground voltage or any other reference voltage value. When the negative voltage rises above the reference voltage, the control stage reduces or arrests a slope or a rise of the positive voltage to neutralize or mitigate the pull of the positive voltage on the negative voltage. To control the negative voltage based on the positive voltage, the control stage compares the positive voltage (or a voltage representative thereof) to a reference voltage. When the positive voltage (or a representative thereof) drops below the reference voltage, the control stage reduces or arrests a slope or a rise of the negative voltage to neutralize or mitigate the pull of the negative voltage on the positive voltage.

DETAILED DESCRIPTION

Figure 1:
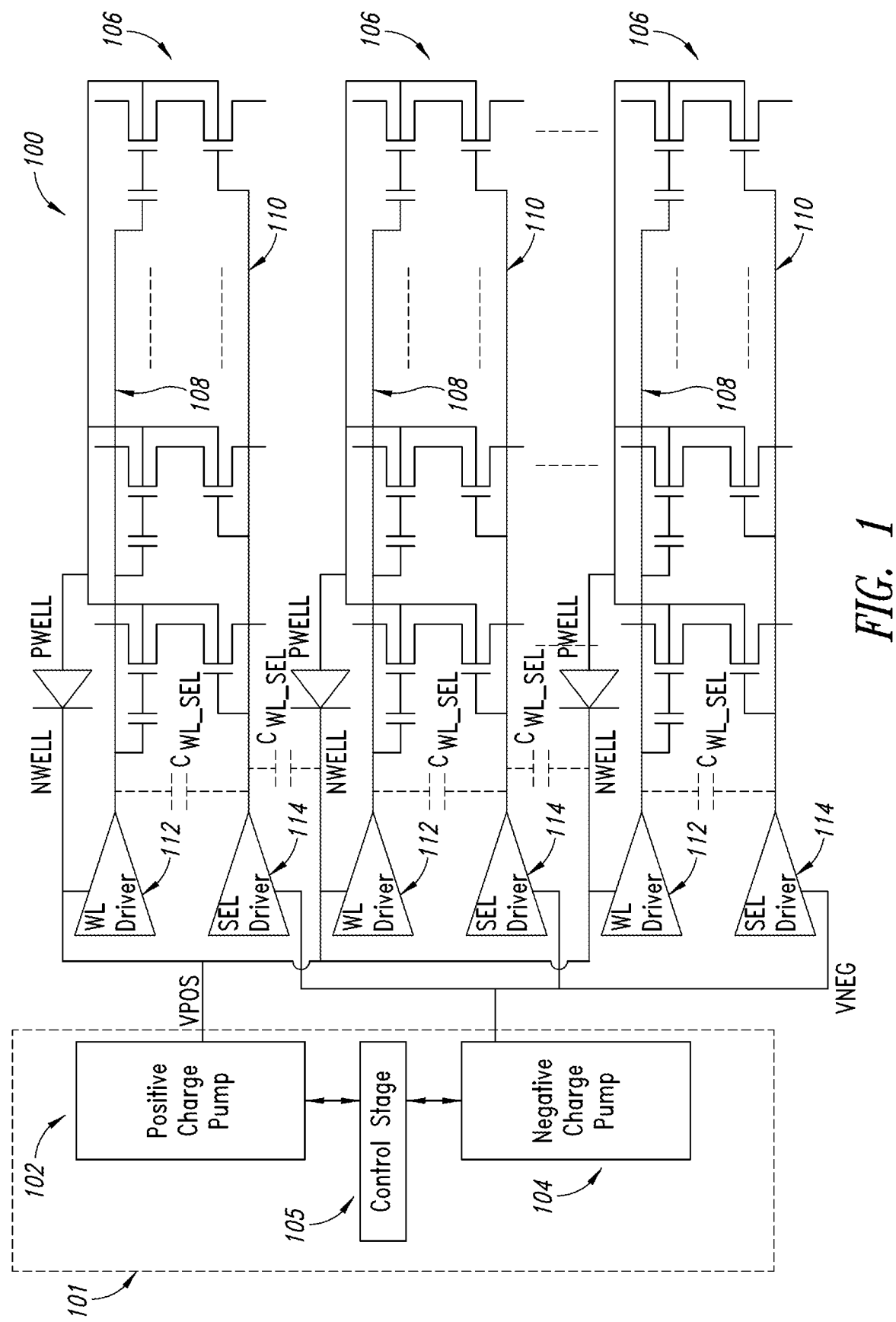
FIG. 1 shows a circuit diagram of a memory supplied by a voltage supply circuit.

FIG. 1 shows a circuit diagram of a memory 100 supplied by a voltage supply circuit 101. The voltage supply circuit 101 includes a positive charge pump 102, a negative charge pump 104 and a control stage 105. The control stage 105 is coupled to both the positive and negative charge pumps 102, 104. The memory 100 includes a plurality of memory sectors 106 for storing data. Each memory sector 106 includes a word line 108, a selection line 110, a word line buffer 112 and a selection line buffer 114. The memory sector 106 may include multiple transistors, capacitances, diodes, and logic gates, among others that are configured to store data and not described herein in structural detail.

The positive charge pump 102 outputs a positive voltage (VPOS) to the word line buffer 112 and the negative charge pump 104 outputs a negative voltage (VNEG) to the selection line buffer 114. The word line buffer 112 operates the word line 108 of the memory sector 106 using the positive voltage and the selection line buffer 114 operates the selection line 110 of the memory sector 106 using the negative voltage.

The memory sector 106 is densely populated with word lines 108 and selection lines 110 and parasitic capacitances (each denoted as $C_{WL\_SEL}$ in FIG. 1) emerge between various word lines 108 and selection lines 110 in the memory sector 106. As the density of the memory sector 106 increase so does the parasitic capacitance ($C_{WL\_SEL}$). In addition, a parasitic capacitance (each denoted as $C_{NW\_SEL}$ in FIG. 1) emerges between the n-wells of the transistors of the memory sector 106 and the selection line 110.

During the ramp-up of the positive voltage (e.g., from zero voltage or supply voltage to a desired positive voltage value) and the negative voltage (e.g., from zero voltage to a desired negative voltage value), the parasitic capacitances of the memory sector 106 influence the positive and negative voltages. The parasitic capacitances pull the negative voltage output by the negative charge pump 104 to the positive voltage output by the positive charge pump 102, and vice-versa. Due to the fact that the magnitude of the positive voltage is typically greater than the magnitude of the negative voltage, the effect of the parasitic capacitances is typically more pronounced on the negative voltage.

The parasitic capacitances result in the positive and negative charge pumps 102, 104 using additional or more time to reach their respective desired output voltages or, in some cases, never reaching their respective output voltages. This may result in an operational failure of the memory 100 or sectors 106 thereof.

The control stage 105 of the voltage supply circuit 101 is coupled to both the positive and negative charge pumps 102, 104. In various embodiments, the control stage 105 may have an input coupled to the negative charge pump 104 and an output coupled to the positive charge pump 102. The control stage 105 receives the negative voltage supplied by the negative charge pump 104 and controls the positive charge pump 102 based on the negative voltage. For example, the control stage 105 may compare the negative voltage to a reference voltage for the negative voltage. The control stage 105 determines whether the negative voltage exceeds the reference voltage. When the negative voltage exceeds the reference voltage, the control stage 105 may operate to inhibit a slope, rise or increase in the positive voltage supplied by the positive charge pump 102 to mitigate the pull of the negative voltage towards the positive voltage due to the parasitic capacitances of the memory sector 106.

In various embodiments described herein, the control stage 105 may have an input coupled to the positive charge pump 102 and an output coupled to the negative charge pump 104. The control stage 105 receives the positive voltage supplied by the positive charge pump 102 and controls the negative charge pump 104 based on the positive voltage. For example, the control stage 105 may compare the positive voltage to a reference voltage for the positive voltage and determine whether the positive voltage is below the reference voltage. When the positive voltage is below the reference voltage, the control stage 105 may operate to stem a decrease in the negative voltage supplied by the negative charge pump 104 to mitigate the pull of the positive voltage towards the negative voltage due to the parasitic capacitances of the memory sector 106.

The control stage 105 may have respective inputs coupled to the positive and negative charge pumps 102, 104 and respective outputs coupled to the positive and negative charge pumps 102, 104. The control stage 105 may operate simultaneously on the positive and negative charge pumps 102, 104 as described herein.

Figure 2:
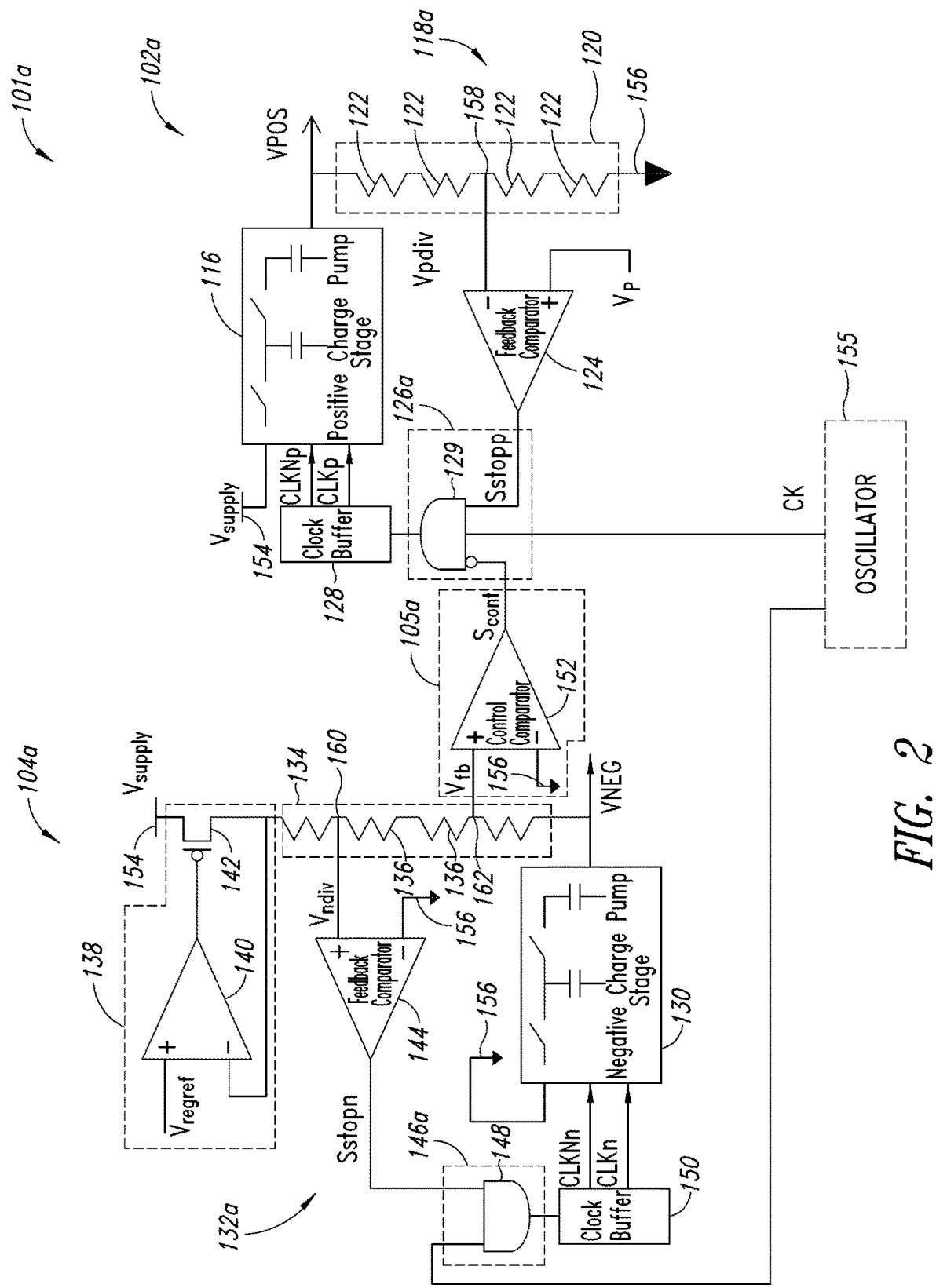
FIG. 2 shows a voltage supply circuit in accordance with an embodiment.

FIG. 2 shows a voltage supply circuit 101a in accordance with an embodiment. In the embodiment of FIG. 2, the positive voltage (VPOS) is controlled based on the negative voltage (VNEG). The voltage supply circuit 101a includes a positive charge pump 102a, a negative charge pump 104a and a control stage 105a. The positive charge pump 102a includes a positive charge pump stage 116 and a feedback stage 118a. The feedback stage 118a includes a voltage detector 120 shown as a resistive ladder comprising a plurality of resistances 122. The feedback stage 118a includes a feedback comparator 124, a clock stage 126a and a clock buffer 128. The clock stage 126a includes an AND gate 129.

The negative charge pump 104a includes a negative charge pump stage 130 and a feedback stage 132a. The feedback stage 132a includes a voltage detector 134 shown as a resistive ladder comprising a plurality of resistances 136. The feedback stage 132a includes a regulation stage 138 including a regulating comparator 140 and a transistor 142. The feedback stage 132a includes a feedback comparator 144 and a clock stage 146a including an AND gate 148. The feedback stage 132a includes a clock buffer 150. The control stage 105a includes a control comparator 152.

In the positive charge pump 102a, the positive charge pump stage 116 has a first input coupled to a supply voltage node 154. The supply voltage node 154 provides a supply voltage (Vsupply) to the positive charge pump stage 116. The positive charge pump stage 116 has a second input coupled to a first output of the clock buffer 128. The positive charge pump stage 116 has a third input coupled to a second output of the clock buffer 128. The positive charge pump stage 116 receives a driving clock signal (CLKp) and an inverted driving clock signal (CLKNp), over the second and third inputs, respectively.

The positive charge pump stage 116 has an output. The positive charge pump stage 116 provides the positive voltage (VPOS) over the output. The voltage detector 120 is coupled between the output of the positive charge pump stage 116 and a ground voltage node 156. The voltage detector 120 has a tap node 158 for providing a divided voltage (Vpdiv) representative of the positive voltage (VPOS). The ground voltage provided by the ground voltage node 156 is a reference voltage for the divided voltage (Vpdiv). In alternative embodiments, the reference voltage for the divided voltage (Vpdiv) may be a voltage other than the ground voltage.

The feedback comparator 124 has an inverting input coupled to the tap node 158 and a non-inverting input configured to receive a first reference voltage (Vp). The feedback comparator 124 has an output. The first reference voltage (Vp) may be a desired voltage for the divided voltage representative of the positive voltage (VPOS) obtained at the tap node 158. It is noted that the feedback comparator 124 may be an error amplifier.

The clock stage 126a (and AND gate 129 thereof) has a first input coupled to the output of the feedback comparator 124, a second input configured to receive a clock signal (CK), a third input coupled to an output of the control stage 105a and an output coupled to an input of the clock buffer 128. The clock signal (CK) is supplied by an oscillator 155 that may be part of the voltage supply circuit 101a or outside of the voltage supply circuit 101a.

In the negative charge pump 104a, the negative charge pump stage 130 has a first input coupled to the ground voltage node 156. The ground voltage node 156 provides a ground voltage to the negative charge pump stage 130. The negative charge pump stage 130 has a second input coupled to a first output of the clock buffer 150 and a third input coupled to a second output of the clock buffer 150. The negative charge pump stage 130 receives a driving clock signal (CLKn) and an inverted driving clock signal (CLKNn), over the second and third inputs, respectively, from the clock buffer 150.

The negative charge pump stage 130 has an output. The negative charge pump stage 130 provides the negative voltage (VNEG) over the output. The voltage detector 134 is coupled between the output of the negative charge pump stage 130 and an output of the regulation stage 138. The output of the regulation stage 138 is taken at a first conduction terminal of the transistor 142. The transistor 142 has a second conduction terminal coupled to the supply voltage node 154 and a control terminal coupled to an output of the regulating comparator 140. The regulating comparator 140 has an inverting input coupled to the first conduction terminal of the transistor 142 and a non-inverting input configured to receive a reference voltage (Vregref) for the regulation stage 138.

The voltage detector 134 has a first tap node 160 for providing a divided voltage (Vndiv) representative of the negative voltage (VNEG). The feedback comparator 144 has a non-inverting input coupled to the first tap node 160 and an inverting input coupled to the ground voltage node 156. The feedback comparator 144 has an output. In an embodiment, the feedback comparator 144 may be an error amplifier.

The clock stage 146a (and AND gate 148 thereof) has a first input coupled to the output of the feedback comparator 144, a second input configured to receive the clock signal (CK) and an output coupled to an input of the clock buffer 128.

The control comparator 152 of the control stage 105a has an inverting input coupled to the ground voltage node 156. The ground voltage node 156 provides a ground voltage or generally a reference voltage for the control comparator 152. The control comparator 152 has a non-inverting input coupled to a second tap node 162 of the voltage detector 134 and an output coupled to the third input of the clock stage 126a (or AND gate 129 thereof).

During operation of the negative charge pump 104a, the negative charge pump stage 130 outputs the negative voltage (VNEG). The voltage detector 134 of the feedback stage 132a receives the negative voltage (VNEG). The voltage detector 134 also receives a regulation voltage provided by the regulation stage 138. The voltage detector 134 divides the negative voltage (VNEG) and supplies at the first tap node 160 the divided voltage (Vndiv) representative of the negative voltage (VNEG). The divided voltage (Vndiv) is between the negative voltage (VNEG) and the regulation voltage. The feedback comparator 144 compares the divided voltage (Vndiv) to the ground voltage. When the divided voltage (Vndiv) is greater than the ground voltage, the feedback comparator 144 asserts, activates or sets to a second logical state (logical one) a clock stop signal (Sstopn). A first logical state is described herein as being zero but may alternatively be one depending on convention. Conversely, when the divided voltage (Vndiv) is less than the ground voltage, the feedback comparator 144 deasserts, deactivates or sets to a first logical state (e.g., zero) the clock stop signal (Sstopn). The clock stop signal (Sstopn) ensures that, in steady state operation, the negative voltage (VNEG) does not drop below the desired negative voltage value.

The AND gate 148 of the clock stage 146a receives the clock stop signal (Sstopn) and the clock signal (CK) and shortens the on-time of the clock signal (CK) based on the clock stop signal (Sstopn). For example, if the clock stop signal (Sstopn) transitions to a logical zero while the clock signal (CK) is a logical one, the AND gate 148 outputs the clock signal (CK) having a logical state of zero. The clock buffer 150, which may include a buffer and an inverting buffer, receives the clock signal (CK) and outputs the driving clock signal (CLKn) and the inverted driving clock signal (CLKNn) to the negative charge pump stage 130. The clock buffer 150 may operate to sharpen the edges of the clock signal (CK) and invert the clock signal (CK) to output the inverted driving clock signal (CLKNn).

The negative charge pump stage 130 receives the driving clock signal (CLKn) and the inverted driving clock signal (CLKNn) and generates the negative voltage (VNEG) based on the driving clock signal (CLKn) and the inverted driving clock signal (CLKNn). The on-time durations of driving clock signal (CLKn) and the inverted driving clock signal (CLKNn) dictate the voltage level of the negative voltage (VNEG).

Similarly, in the positive charge pump 102a, the positive charge pump stage 116 outputs the positive voltage (VPOS). The voltage detector 120 of the feedback stage 118a receives the positive voltage (VPOS). The voltage detector 120 divides the positive voltage (VPOS) and supplies at the tap node 158 the divided voltage (Vpdiv) that is representative of the positive voltage (VPOS). The divided voltage (Vpdiv) is between the positive voltage (VPOS) and the ground voltage. The feedback comparator 124 compares the divided voltage (Vpdiv) to the first reference voltage (Vp), which is the reference voltage for the divided voltage (Vpdiv). When the divided voltage (Vpdiv) is greater than the first reference voltage (Vp), the feedback comparator 124 deasserts, deactivates or sets to the first logical state a clock stop signal (Sstopp). Conversely, when the divided voltage (Vpdiv) is less than the first reference voltage (Vp), the feedback comparator 124 asserts, activates or sets to a second logical state (e.g., one) the clock stop signal (Sstopp).

The AND gate 129 of the clock stage 126a receives the clock stop signal (Sstopp) and the clock signal (CK) and shortens the on-time of the clock signal (CK) based on the clock stop signal (Sstopp). The AND gate 129 ends the on-time of the clock signal (CK) and transitions the clock signal (CK) to a logical zero upon deassertion of the clock stop signal (Sstopp).

For example, if the clock stop signal (Sstopp) transitions to a logical zero while the clock signal (CK) is a logical one, the AND gate 129 outputs the clock signal (CK) having a logical state of zero. The clock buffer 128, which may include a clock buffer and an inverting clock buffer, receives the clock signal (CK) and outputs the driving clock signal (CLKp) and the inverted driving clock signal (CLKNp) to the positive charge pump stage 116. The clock buffer 128 may sharpen the edges of the clock signal (CK) and invert the clock signal (CK) to output the inverted driving clock signal (CLKNp).

The positive charge pump stage 116 receives the driving clock signal (CLKp) and the inverted driving clock signal (CLKNp) and generates the positive voltage (VPOS) based on the driving clock signal (CLKp) and the inverted driving clock signal (CLKNp). The on-time durations of driving clock signal (CLKp) and the inverted driving clock signal (CLKNp) dictate the voltage level of the positive voltage (VPOS).

Without the control stage 105a, the feedback stages 118a, 132a control respective positive and negative voltages (VPOS, VNEG) independently of each other. The feedback stage 118a controls the operation of the positive charge pump stage 116 based on the positive voltage (VPOS) and the feedback stage 132a controls the operation of the negative charge pump stage 130 based on the negative voltage (VNEG).

The control stage 105a interdependently operates the positive and negative charge pumps 102a, 104a. The control stage 105a uses a feedback voltage (Vfb) representative of the negative voltage (VNEG) to control the positive charge pump 102a.

The control stage 105a receives the feedback voltage (Vfb) representative of the negative voltage (VNEG). The feedback voltage (Vfb) may be the negative voltage (VNEG) having undergone voltage division. The control comparator 152 receives, over its non-inverting input, the feedback voltage (Vfb). The control comparator 152 receives the ground voltage over its inverting input. The control comparator 152 compares the feedback voltage (Vfb) to the ground voltage. When the feedback voltage (Vfb) is greater than the ground voltage, the control comparator 152 asserts a control signal (Scont). The control signal (Scont) is inverted and provided to the third input of the AND gate 129. Upon assertion of the control signal (Scont), the AND gate 129 ends the on-time of the clock signal (CK) and transitions the clock signal (CK) to a logical zero thereby reducing the slope of the positive voltage (VPOS). An increase of the feedback voltage (Vfb) above the ground voltage is an indication that the negative voltage (VNEG) is pulled towards the positive voltage (VPOS). The control stage 105a operates to stem the rise of the positive voltage (VPOS) to reduce the pull induced by the positive voltage (VPOS) on the negative voltage (VNEG). The control stage 105a operates to do so by causing on-time of the clock signal (CK) to end.

Figure 3:
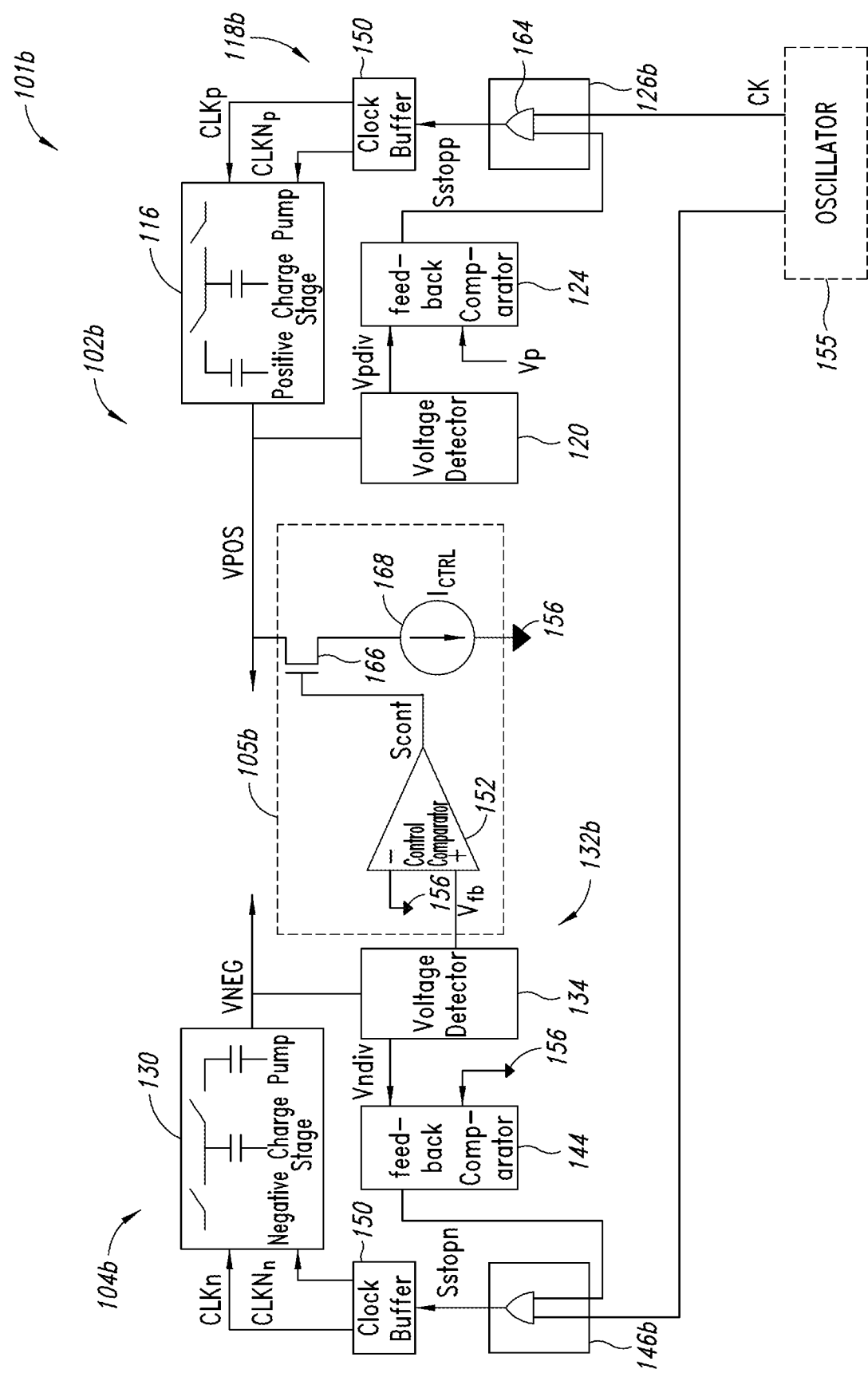
FIG. 3 shows a voltage supply circuit in accordance with an embodiment.

FIG. 3 shows a voltage supply circuit 101b in accordance with an embodiment. Similar elements of the voltage supply circuit 101b described with reference to FIG. 3 as the voltage supply circuit 101a described with reference to FIG. 2 have the same reference numerals.

In the embodiment of FIG. 3, the positive voltage (VPOS) is controlled based on the negative voltage (VNEG). The voltage supply circuit 101b of FIG. 3 differs from the voltage supply circuit 101a described with reference to FIG. 2 in that the control comparator 152 directly reduces the positive voltage (VPOS) by sinking a control current ($I_{CTRL}$) therefrom. That is in contrast to reducing the on-time duration of the driving clock signal (CLKp) of the positive charge pump stage 116.

The voltage supply circuit 101b includes a positive charge pump 102b having a feedback stage 118b and a negative charge pump 102b having a feedback stage 132b. The voltage supply circuit 101b includes a control stage 105b. The clock stage 126b of the feedback stage 118b includes an AND gate 164 having a first input coupled to the output of the feedback comparator 124, a second input configured to receive a clock signal (CK) and an output coupled to an input of the clock buffer 128. In contrast to the AND gate 129 of the clock stage 126a described with reference to FIG. 2, the AND gate 164 forgoes the third input and is instead similarly configured as the AND gate 148 of the negative charge pump 104b.

The control stage 105b includes, in addition to the control comparator 152, a control transistor 166 and a control current source 168. An inverting input of the control comparator 152 is coupled to the ground voltage node 156 and a non-inverting input is configured to receive the feedback voltage (Vfb) representative of the negative voltage (VNEG) from the voltage detector 134. The output of the control comparator 152 is coupled to a control terminal of the control transistor 166. The control transistor 166 has a first conduction terminal coupled to the output of the positive charge pump stage 116 and a second conduction terminal coupled to an anode of the control current source 168. The control current source 168 has a cathode coupled to the ground voltage node 156 that provides a ground voltage.

The control current source 168 supplies the control current ($I_{CTRL}$). When the feedback voltage (Vfb) rises above the ground voltage, the control comparator 152 asserts its output control signal (Scont) rendering the control transistor 166 conductive and sinking the control current ($I_{CTRL}$) from the positive voltage (VPOS) thereby reducing the positive voltage (VPOS) or a rise or a slope thereof. When the feedback voltage (Vfb) drops is below the ground voltage, the control comparator 152 does not assert its output control signal (Scont). The control transistor 166 operates in the nonconductive state and the control stage 105b does not sink the control current ($I_{CTRL}$) from the positive voltage (VPOS).

Figure 4:
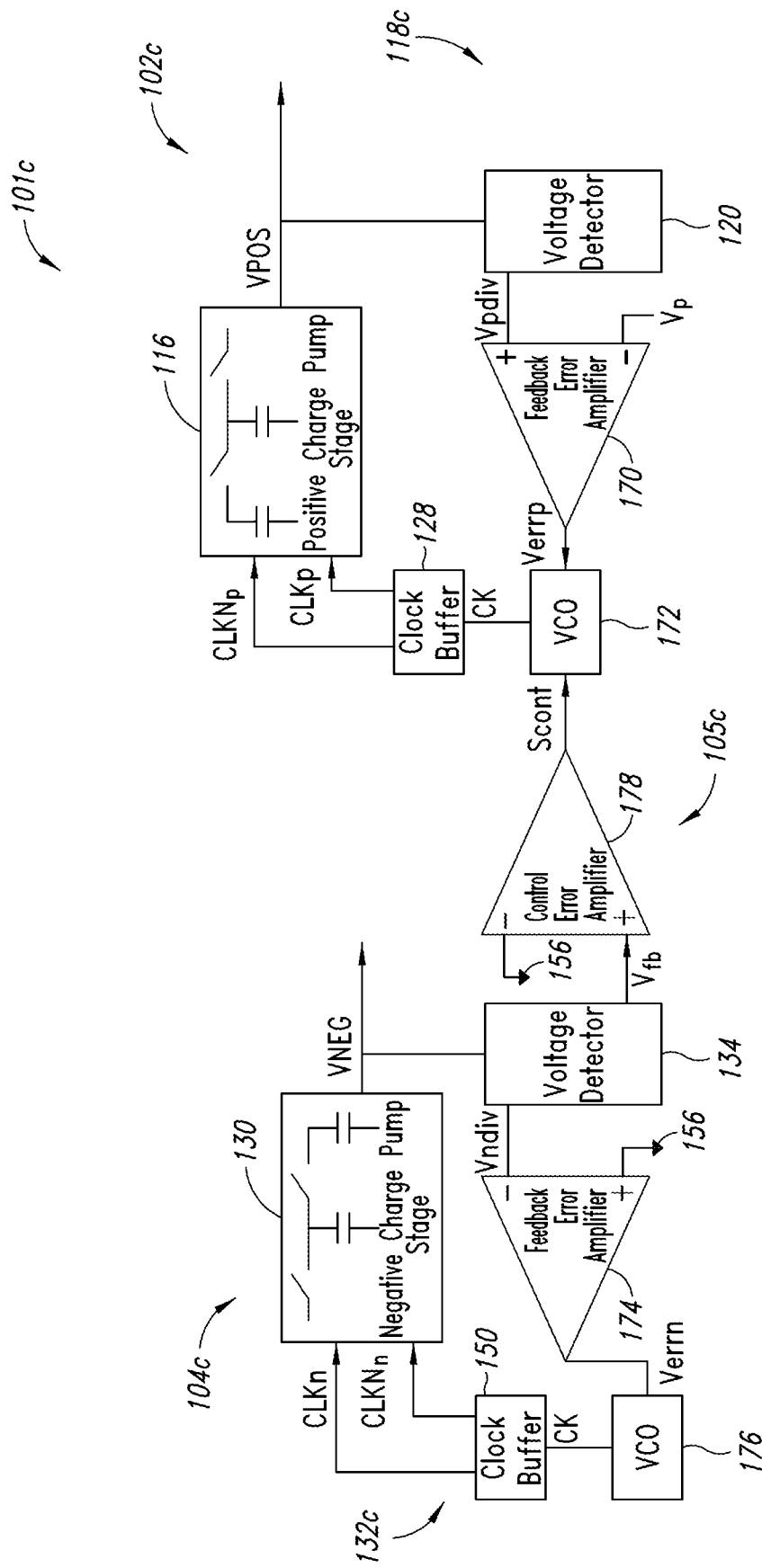
FIG. 4 shows a voltage supply circuit in accordance with an embodiment.

FIG. 4 shows a voltage supply circuit 101c in accordance with an embodiment. Similar elements of the voltage supply circuit 101c described with reference to FIG. 4 as the voltage supply circuit 101a described with reference to FIG. 2 have the same reference numerals.

In the embodiment of FIG. 4, the positive voltage (VPOS) is controlled based on the negative voltage (VNEG). The voltage supply circuit 101c of FIG. 4 differs from the voltage supply circuit 101a described with reference to FIG. 2 in that the voltage supply circuit 101c uses voltage-controlled oscillators to control the clock signals driving the positive and negative charge pump stages 116, 130. The voltage supply circuit 101c includes arrangements of a voltage-controlled oscillator and error amplifier in place of the arrangements of the feedback comparator 124, 144 and clock stage 126a, 146a.

The voltage supply circuit 101c includes a positive charge pump 102c having a feedback stage 118c. The feedback stage 118c includes a feedback error amplifier 170 and a voltage-controlled oscillator 172. The voltage supply circuit 101c includes a negative charge pump 104c having a feedback stage 132c. The feedback stage 132c includes a feedback error amplifier 174 and a voltage-controlled oscillator 176. The voltage supply circuit 101c includes control stage 105c including a control error amplifier 178.

In the positive charge pump 102c, the feedback error amplifier 170 has an inverting input configured to receive the first reference voltage (Vp) and a non-inverting input coupled to the voltage detector 120 and configured to receive the divided voltage (Vpdiv) representative of the positive voltage (VPOS). The feedback error amplifier 170 has an output. The voltage-controlled oscillator 172 has a first input coupled to the output of the feedback error amplifier 170, a second input and an output coupled to the input of the clock buffer 128. In the negative charge pump 104c, the feedback error amplifier 174 has a non-inverting input coupled to the ground voltage node 156 and an inverting input coupled to the voltage detector 134 and configured to receive the divided voltage (Vndiv) representative of the negative voltage (VNEG). The feedback error amplifier 170 has an output. The voltage-controlled oscillator 176 has an input coupled to the output of the feedback error amplifier 174, and an output coupled to the input of the clock buffer 150.

The control error amplifier 178 has an inverting input coupled to the ground voltage node 156 and a non-inverting input coupled to the voltage detector 134 configured to receive the feedback voltage (Vfb) representative of the negative voltage (VNEG) from the voltage detector 134. The control error amplifier 178 has an output coupled to the second input of the voltage-controlled oscillator 172.

In the negative charge pump 104c, the feedback error amplifier 174 determines a difference between the divided voltage (Vndiv) representative of the negative voltage (VNEG) and the ground voltage and outputs an error signal (Verrn) representative of the difference. The voltage-controlled oscillator 176 receives the error signal (Verrn) and outputs the clock signal (CK) to the clock buffer 150 based on the error signal (Verrn). The magnitude and sign of the difference and the error signal (Verrn) determine the frequency of the clock signal (CK) used to drive the negative charge pump stage 130. As the error signal (Verrn) increases, the frequency of the clock signal (CK) generated by the voltage-controlled oscillator 176 also increases.

Similarly, in the positive charge pump 102c, the feedback error amplifier 170 determines a difference between the divided voltage (Vpdiv) representative of the positive voltage (VPOS) and the first reference voltage (Vp). The feedback error amplifier 170 outputs an error signal (Verrp) representative of the difference. The voltage-controlled oscillator 172 receives the error signal (Verrp) and outputs the clock signal (CK) to the clock buffer 128 having a frequency that is based on the error voltage error signal (Verrp).

The voltage-controlled oscillator 172 is additionally controlled by the control error amplifier 178. The control error amplifier 178 receives determines a difference between the ground voltage node 156 and the feedback voltage (Vfb) and outputs the control signal (Scont) representative of the difference to the voltage-controlled oscillator 172. The control signal (Scont) and the error signal (Verrp) may both contribute (e.g., by additive combination) to setting the frequency of the clock signal (CK). When the negative voltage (VNEG) drifts in the direction of the positive voltage (VPOS), a voltage level of the control signal (Scont) decreases to reduce the frequency of the clock signal (CK).

In an embodiment, the voltage supply circuit 101 may use supply voltage control to control the frequency of the clock signal that drives the positive and negative charge pump stages 116, 130.

Figure 5:
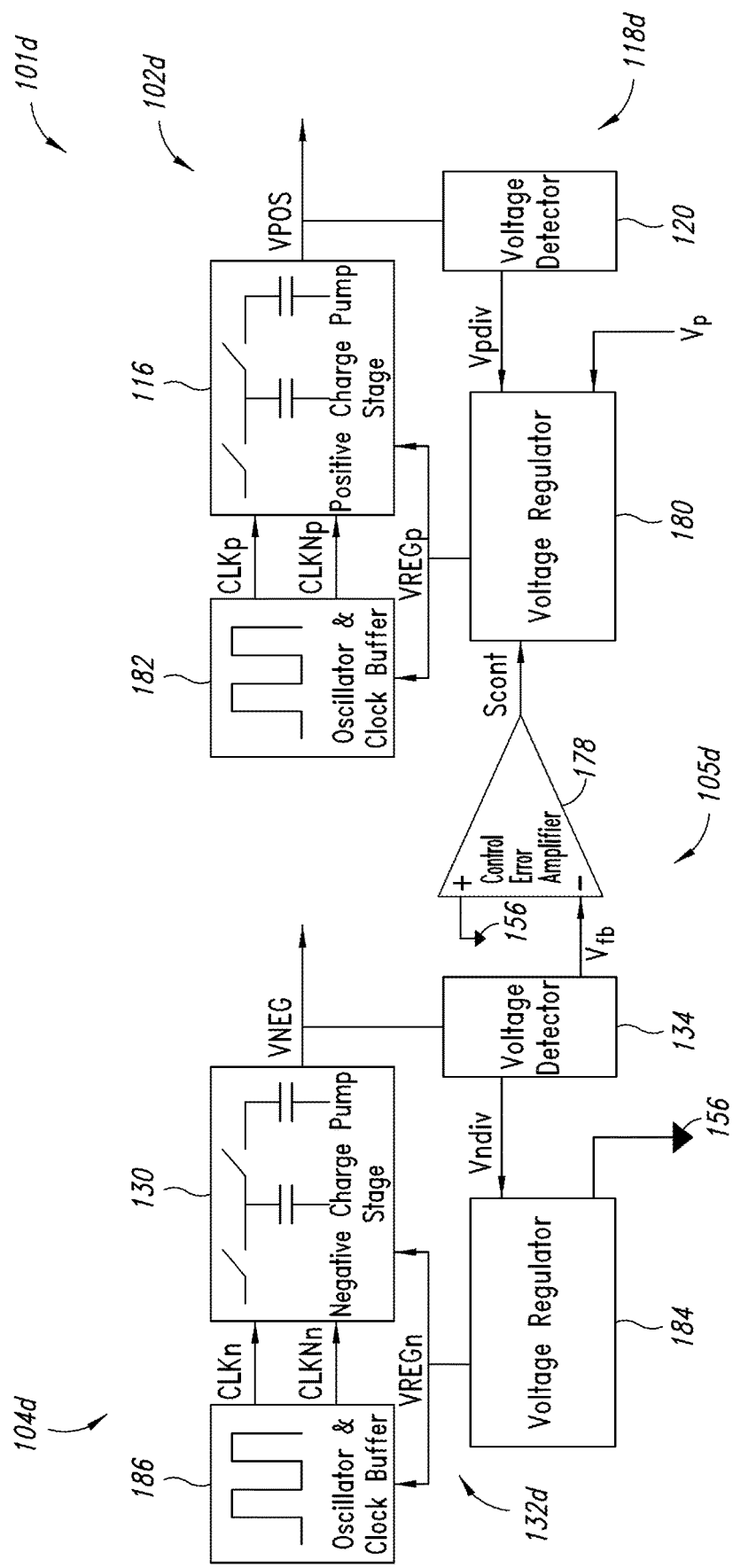
FIG. 5 shows a voltage supply circuit in accordance with an embodiment.

FIG. 5 shows a voltage supply circuit 101d in accordance with an embodiment. Similar elements of the voltage supply circuit 101d described with reference to FIG. 5 as the voltage supply circuit 101a described with reference to FIG. 2 have the same reference numerals. In the embodiment of FIG. 5, the positive voltage (VPOS) is controlled based on the negative voltage (VNEG). The voltage supply circuit 101d of FIG. 5 uses controls the supply voltage of an oscillator to control the frequency of the clock signals driving the positive and negative charge pump stages 116, 130.

The positive charge pump 102d includes a positive charge pump stage 116 and a feedback stage 118d. The feedback stage 118d includes the voltage detector 120, a voltage regulator 180 and an oscillator and clock buffer 182. The negative charge pump 104d includes the negative charge pump stage 130 and a feedback stage 132d. The feedback stage 132d includes the voltage detector 134, a voltage regulator 184 and an oscillator and clock buffer 186. The oscillator and clock buffer 182, 186 may be a combination of an oscillator and a clock buffer, such as the clock buffer 128, 150 described herein. Similar to the control stage 105c, the control stage 105d includes a control error amplifier 178.

The voltage regulator 180 has a first input configured to receive the first reference voltage (Vp), a second input configured to receive the divided voltage (Vpdiv) representative of the positive voltage (VPOS), a third input and an output configured to provide a first regulated voltage (VREGp). The oscillator and clock buffer 182 has an input coupled to the output of the voltage regulator 180, a first output for providing the driving clock signal (CLKp) and a second output for providing the inverted driving clock signal (CLKNp) to the positive charge pump stage 116. In the negative charge pump 104d, the voltage regulator 184 has a first input configured to receive the ground voltage, a second input configured to receive the divided voltage (Vndiv) representative of the negative voltage (VNEG) and an output configured to provide a second regulated voltage (VREGn). The oscillator and clock buffer 186 has an input coupled to the output of the voltage regulator 184, a first output for providing the driving clock signal (CLKn) and a second output for providing the inverted driving clock signal (CLKNn) to the negative charge pump stage 130.

The output of the control error amplifier 178 is coupled to the third input of the voltage regulator. During operation, the voltage regulator 180 compares the divided voltage (Vpdiv) with the first reference voltage (Vp) and outputs the first regulated voltage (VREGp), based on the comparison, to both the oscillator and clock buffer 182 and the positive charge pump stage 116. The first regulated voltage (VREGp) is the supply voltage of the oscillator and clock buffer 182 and the positive charge pump stage 116. When the first regulated voltage (VREGp) increases, the frequency of the driving clock signals (CLKp, CLKNp) supplied by the oscillator and clock buffer 182 increases. Additionally, the positive voltage (VPOS) supplied by the positive charge pump stage 116 also increases. The voltage regulator modulates the first regulated voltage (VREGp) so that the difference between the divided voltage (Vpdiv) and the first reference voltage (Vp) is minimized. Similarly, the voltage regulator 184 controls the second regulated voltage (VREGn) to minimize the difference between the ground voltage and the divided voltage (Vndiv). The second regulated voltage (VREGn) is supplied to the oscillator and clock buffer 186 and the negative charge pump stage 130.

The voltage regulator 180 regulates its output voltage based on the combination (for example, additive combination) of the control signal (Scont) and the difference between the divided voltage (Vpdiv) and the first reference voltage (Vp) to control the first regulated voltage (VREGp). The control signal (Scont) is positively correlated with (e.g., proportional to) to the difference between the ground voltage and proportional. The voltage regulator 180 receives the control signal (Scont) and controls the first regulated voltage (VREGp) based on the control signal (Scont). The voltage regulator 180 increases or decreases the first regulated voltage (VREGp). The control error amplifier 178 and voltage regulator 180 operate to set and control the first regulated voltage (VREGp) to minimize the difference between the ground voltage and the feedback voltage (Vfb).

The voltage supply circuits 101a, 101b, 101c, 101d described herein control the positive voltage (VPOS) using the negative voltage (VNEG). Corresponding embodiments are described herein in which control of the negative voltage (VNEG) is based on the positive voltage (VPOS).

Figure 6:
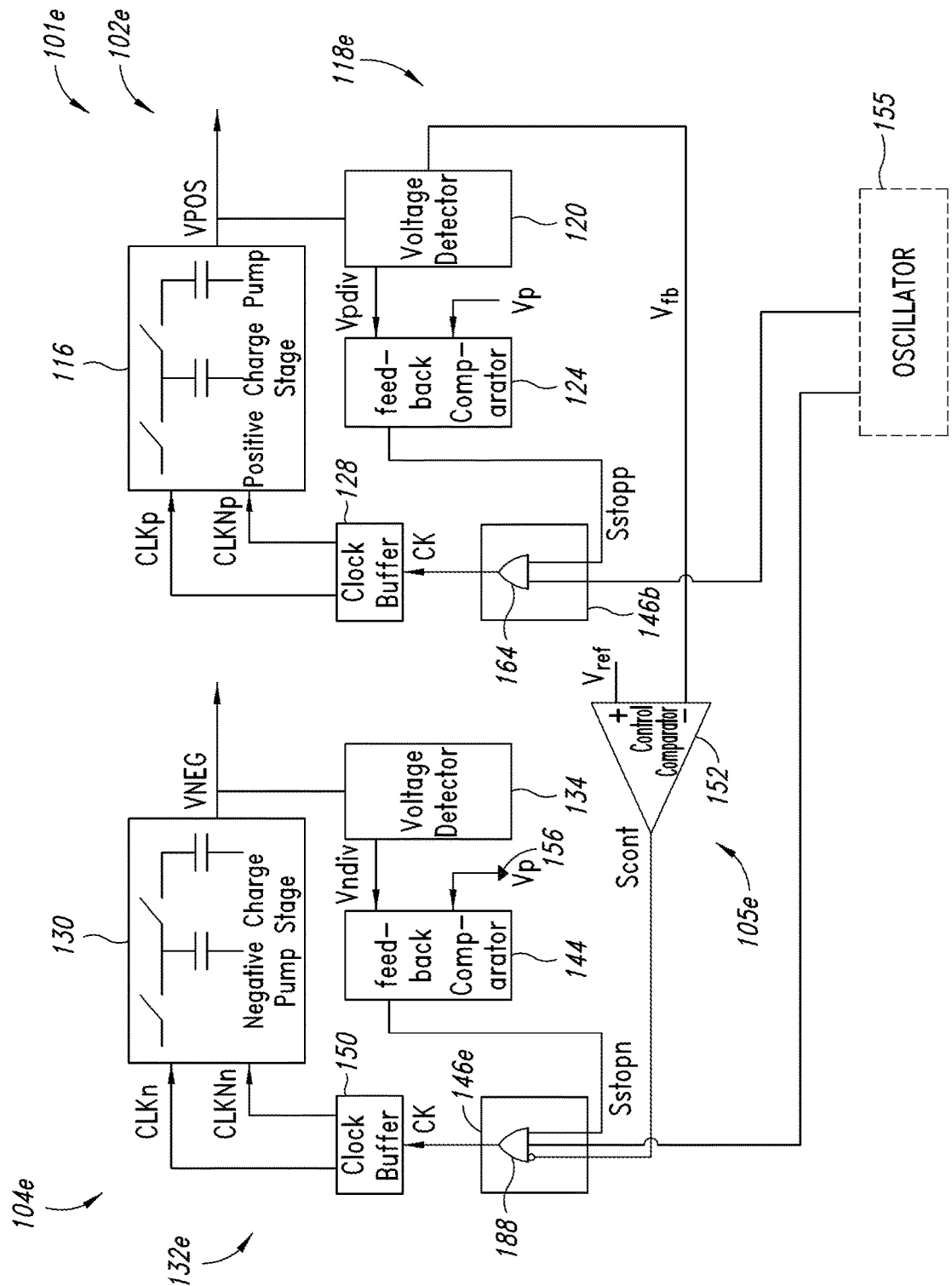
FIG. 6 shows a voltage supply circuit in accordance with an embodiment.

FIG. 6 shows a voltage supply circuit 101e in accordance with an embodiment. The voltage supply circuit 101e controls the negative voltage (VNEG) based on the positive voltage (VPOS). Similar elements of the voltage supply circuit 101e described with reference to FIG. 5 as the voltage supply circuit 101a described with reference to FIG. 2 have the same reference numerals.

The voltage supply circuit 101e includes a positive charge pump 102e having a feedback stage 118e, a negative charge pump 104e having a feedback stage 132e and a control stage 105e. The control stage 105e includes the control comparator 152. The inverting input of the control comparator 152 is configured to receive a feedback voltage (Vfb) from the voltage detector 120. The feedback voltage (Vfb) may be tapped at a node of the voltage detector 120 similar to the feedback voltage (Vfb) of the negative charge pump 102a described with reference to FIG. 2. The non-inverting input of the control comparator 152 is configured to receive a second reference voltage (Vref), which may be a desired voltage for the feedback voltage (Vfb).

The negative charge pump 104e includes a clock stage 146e having an AND gate 188 similarly configured as the AND gate 129 of the positive charge pump 102a of FIG. 2. The AND gate 188 receives the clock stop signal (Sstopn), a clock signal from the oscillator 155 and the control signal (Scont) and shortens the on-time duration of the clock signal based on the clock stop signal (Sstopn) and the control signal (Scont).

Figure 7:
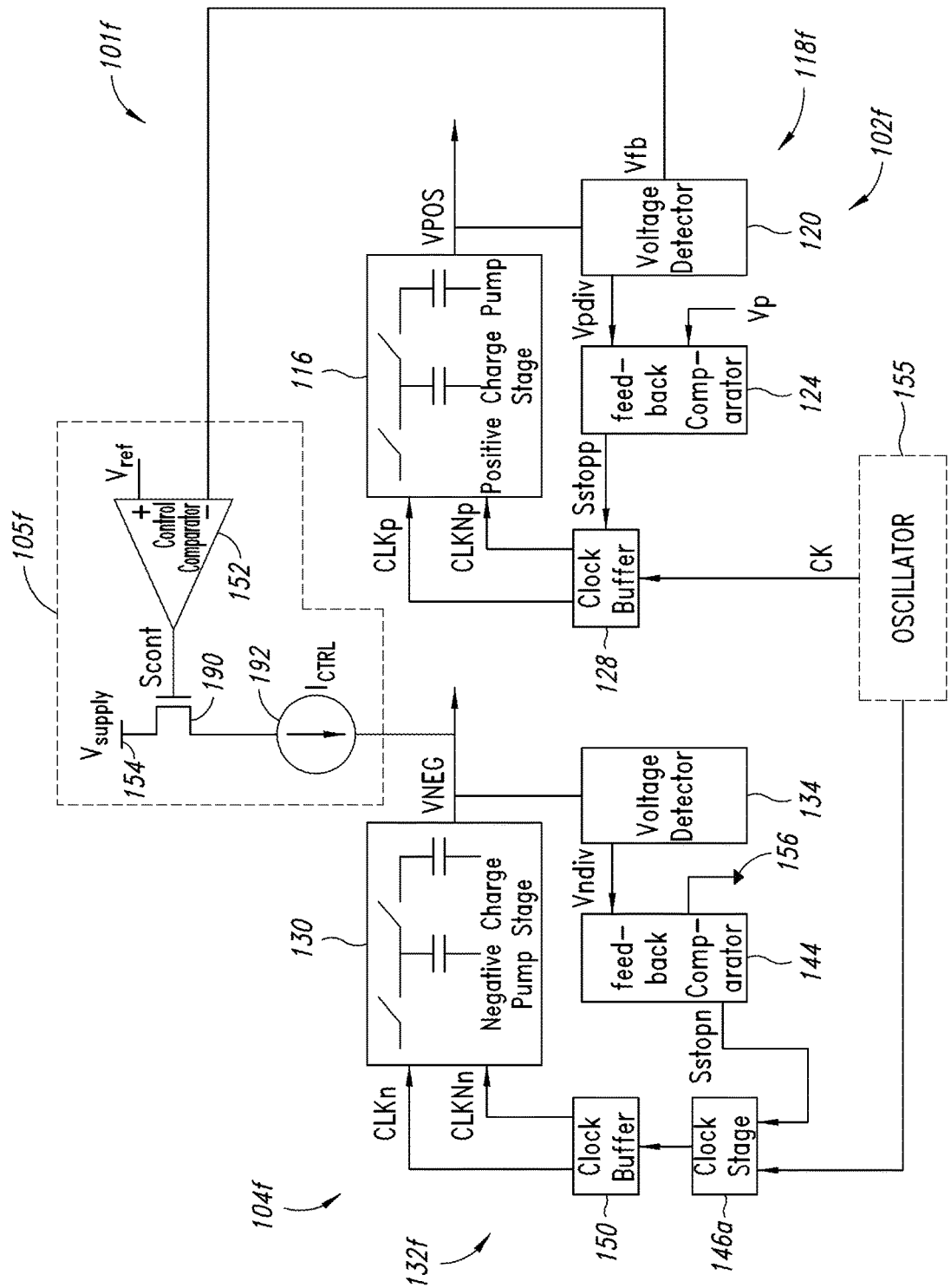
FIG. 7 shows a voltage supply circuit in accordance with an embodiment.

FIG. 7 shows a voltage supply circuit 101f in accordance with an embodiment. The voltage supply circuit 101f controls the negative voltage (VNEG) based on the positive voltage (VPOS). The voltage supply circuit 101f uses a similar control mechanism as that of the voltage supply circuit 101b described with reference to FIG. 3 albeit with the negative voltage (VNEG) being controlled based on the positive voltage (VPOS). In particular, the voltage supply circuit 101f includes a positive charge pump 102f having a feedback stage 118f, a negative charge pump 104f having a feedback stage 132f and a control stage 105f. The control stage 105f includes the control comparator 152, a control transistor 190 and a control current source 192. The control transistor 190 has a first conduction terminal coupled to the supply voltage node, a second conduction terminal and a control terminal coupled to the output of the control comparator 152. The control comparator 152 may be an analog or a digital comparator. The control comparator 152 may also be an error amplifier.

The control current source 192 has an anode coupled to the second conduction terminal of the control transistor 190 and cathode coupled to the output of the negative charge pump stage 130. The inverting input of the control comparator 152 is configured to receive the feedback voltage (Vfb) from the voltage detector 120 and the non-inverting input of the control comparator 152 is configured to receive a second reference voltage (Vref), which may be a desired voltage for the feedback voltage (Vfb).

When the feedback voltage (Vfb) goes below the second reference voltage (Vref), the control comparator 152 asserts its output control signal (Scont) rendering the control transistor 190 conductive and sourcing the control current ($I_{CTRL}$) to the negative voltage (VNEG) thereby positively increasing the negative voltage (VNEG) or reducing a rise or a slope thereof. Otherwise, the control transistor 190 is non-conductive and the control current ($I_{CTRL}$) is not added to the negative voltage (VNEG).

Figure 8:
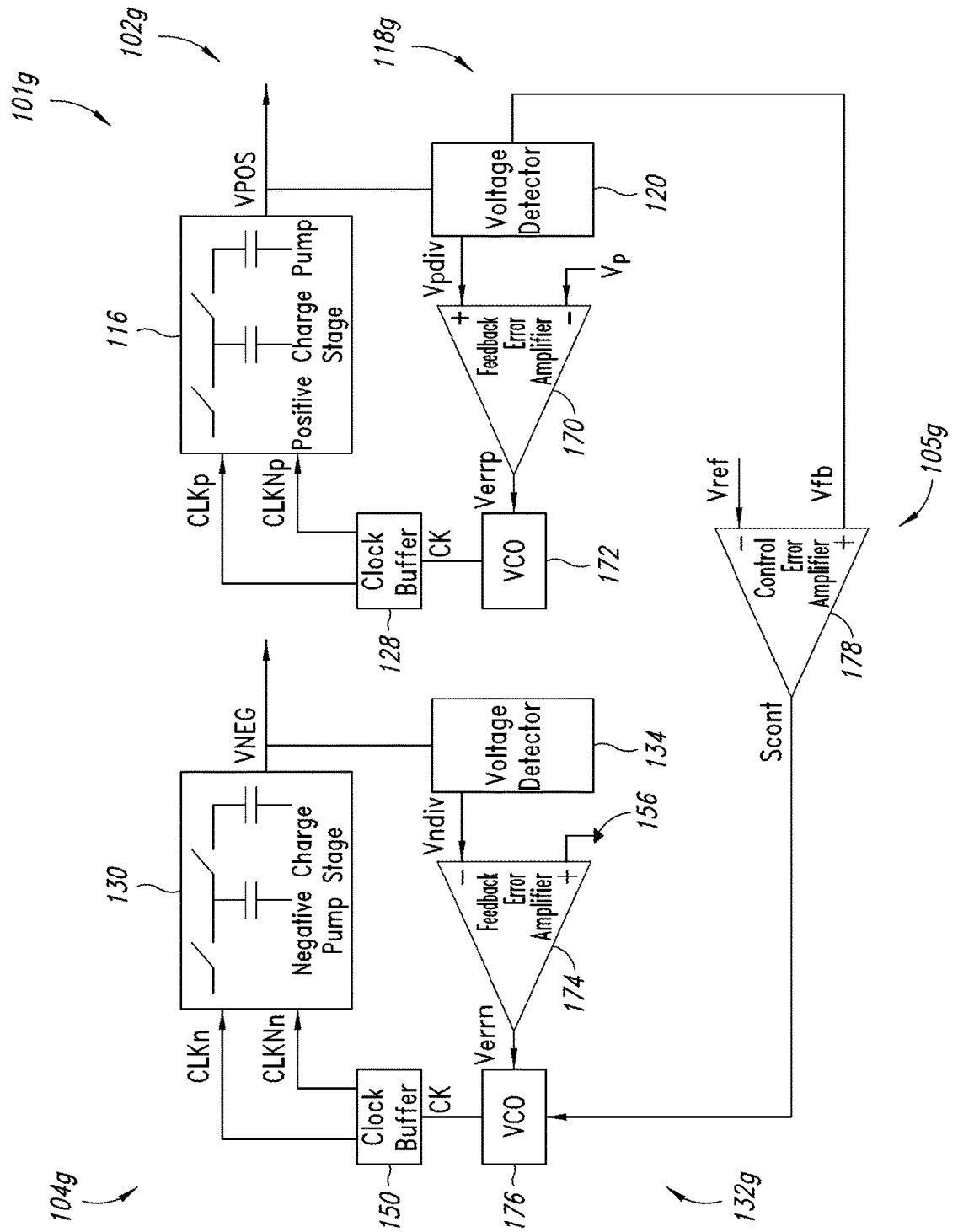
FIG. 8 shows a voltage supply circuit in accordance with an embodiment.

FIG. 8 shows a voltage supply circuit 101g in accordance with an embodiment. The voltage supply circuit 101g controls the negative voltage (VNEG) based on the positive voltage (VPOS). The voltage supply circuit 101g uses a similar control mechanism as that of the voltage supply circuit 101c described with reference to FIG. 4 with the difference being that the negative voltage (VNEG) is controlled based on the positive voltage (VPOS). The voltage supply circuit 101g includes a positive charge pump 102g having a feedback stage 118g, a negative charge pump 104g having a feedback stage 132g and a control stage 105g. The control stage 105g includes the control error amplifier 178, which controls the voltage-controlled oscillator 176.

The control error amplifier 178 determines a difference between the second reference voltage (Vref) and the feedback voltage (Vfb) and outputs the control signal (Scont) representative of the difference to the voltage-controlled oscillator 176. The control signal (Scont) and the error signal (Verrn) may both contribute (e.g., by additive combination) to setting the frequency of the clock signal (CK) generated by the voltage-controlled oscillator 176. When the positive voltage (VPOS) drifts in the direction of the negative voltage (VNEG), the drift is reflected in the control signal (Scont) and the frequency of the clock signal (CK) generated by the voltage-controlled oscillator 176 is adjusted to counter the drift.

Figure 9:
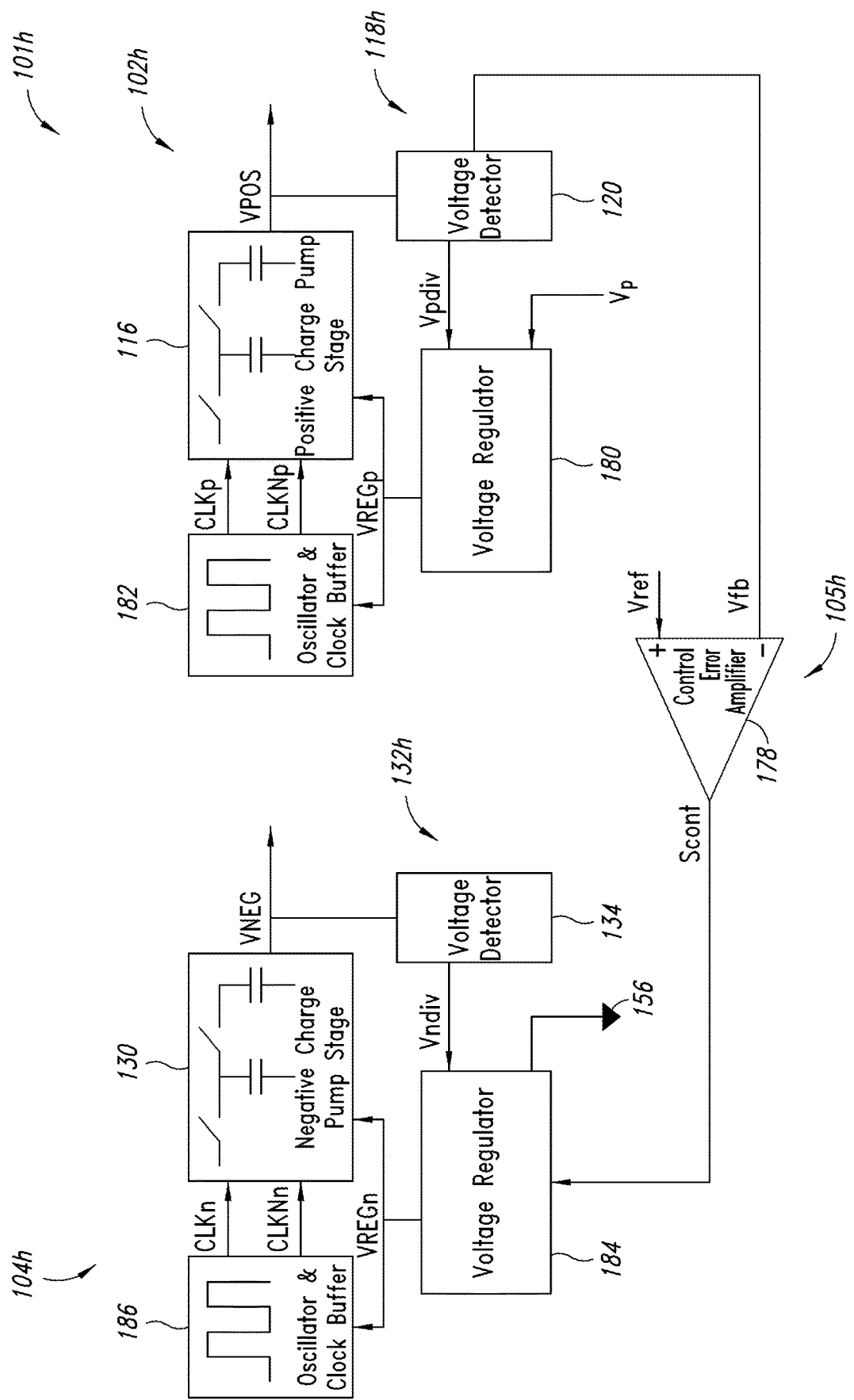
FIG. 9 shows a voltage supply circuit in accordance with an embodiment.

FIG. 9 shows a voltage supply circuit 101h in accordance with an embodiment. The voltage supply circuit 101h controls the negative voltage (VNEG) based on the positive voltage (VPOS). The voltage supply circuit 101h uses a similar control mechanism as that of the voltage supply circuit 101h described with reference to FIG. 5 with the difference being that the negative voltage (VNEG) is controlled based on the positive voltage (VPOS). The voltage supply circuit 101h includes a positive charge pump 102h having a feedback stage 118h, a negative charge pump 104h having a feedback stage 132h and a control stage 105h. The control stage 105h includes the control error amplifier 178, which controls the voltage regulator 184 of the negative charge pump 104h.

The control error amplifier 178 determines a difference between the second reference voltage (Vref) and the feedback voltage (Vfb) and outputs the control signal (Scont) representative of the difference to the voltage regulator 184. The control signal (Scont) and the error signal (Verrn) may both contribute (e.g., by additive combination) to setting the frequency of the clock signal (CK) generated by the voltage-controlled oscillator 176. When the positive voltage (VPOS) drifts in the direction of the negative voltage (VNEG), the drift is reflected in the control signal (Scont) and the frequency of the clock signal (CK) generated by the voltage-controlled oscillator 176 is adjusted to counter the drift.

The voltage regulator 184 regulates its output voltage (the second regulated voltage (VREGn)) based on the combination (for example, additive combination) of the control signal (Scont) and the difference between the divided voltage (Vndiv) and the ground voltage. The control signal (Scont) is positively correlated with (e.g., proportional to) to the difference between the second reference voltage (Vref) and the feedback voltage (Vfb). The voltage regulator 184 receives the control signal (Scont) and controls the second regulated voltage (VREGn) based on the control signal (Scont). The voltage regulator 184 increases or decreases the second regulated voltage (VREGn). The control error amplifier 178 and voltage regulator 184 operate to set and control the second regulated voltage (VREGn) to minimize the difference between the second reference voltage (Vref) and the feedback voltage (Vfb).

Figure 10:
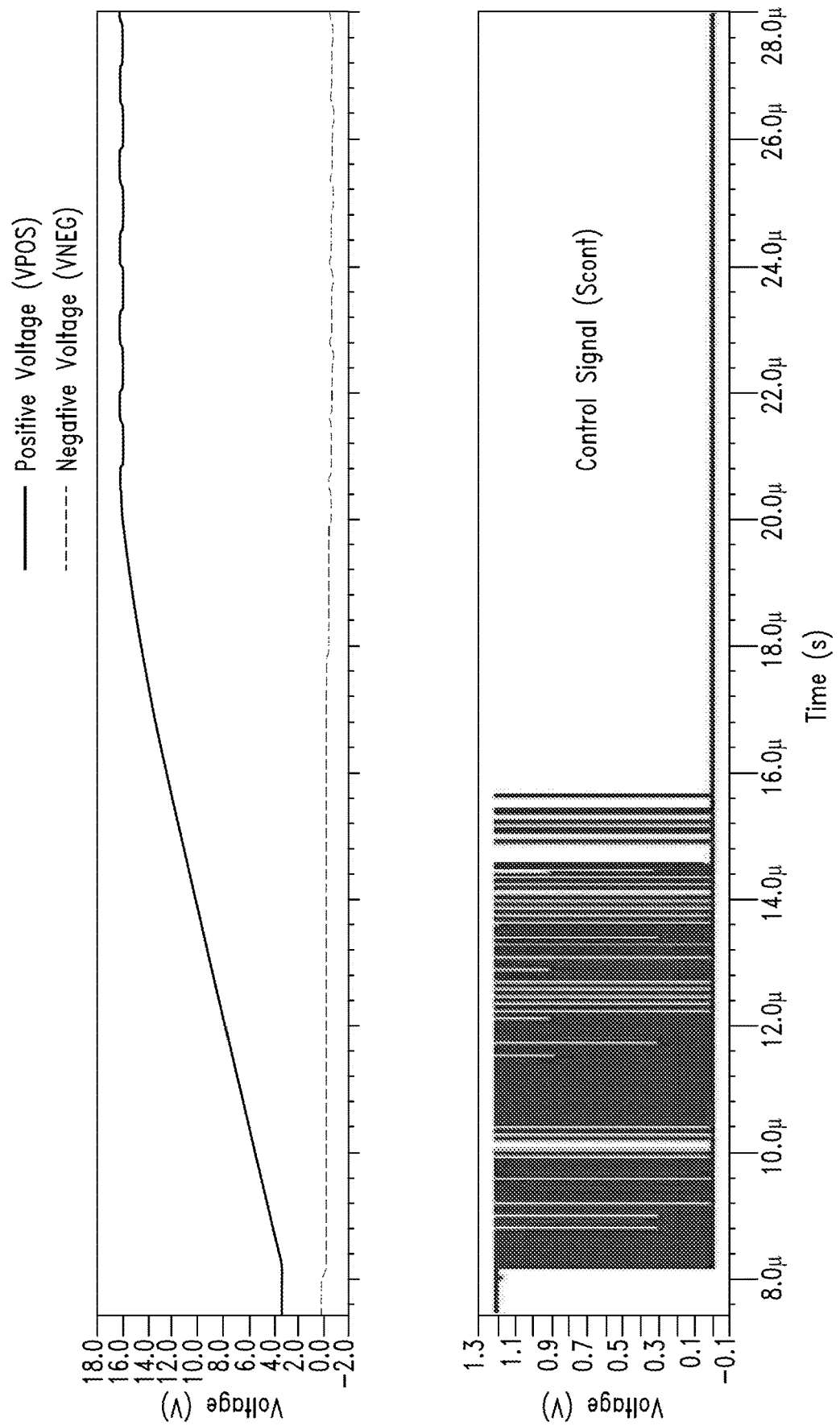
FIG. 10 shows signals diagrams of a positive voltage, a negative voltage and a control signal of the voltage supply circuit described with reference to FIG. 2.

FIG. 10 shows signals diagrams of the positive voltage (VPOS), negative voltage (VNEG) and control signal (Scont) of the voltage supply circuit 101a described with reference to FIG. 2. Initially, the positive voltage (VPOS) increases and the negative voltage (VNEG) decreases. The control stage 105a prevents the negative voltage (VNEG) from gravitating or drifting towards the positive voltage (VPOS) (e.g., due to parasitic capacitances). The control stage 105a asserts the control signal (Scont). The control signal (Scont), when asserted, ends the active period of the driving clock signal (CLKp) of the positive charge pump stage 116 and results in reducing the slope of the positive voltage (VPOS).

It is noted that the control stages 105a, 105b, 105c, 105d may be used to control the positive voltage (VPOS) and mitigate voltage conversion during an initial transient stage when the positive voltage (VPOS) and the negative voltage (VNEG) are actively diverging from each other. During steady state conditions, the operation of the feedback stages 118a, 118b, 118c, 118d may be sufficient keep the positive voltage (VPOS) above a desired positive voltage value, such as 16 Volts (V). Similarly, the control stages 105e, 105f, 105g, 105h may be used to control the negative voltage (VNEG) and mitigate voltage conversion during the initial transient stage. During steady state conditions, the operation of the feedback stages 118a, 118b, 118c, 118d may similarly be sufficient keep the positive voltage (VPOS) above a desired negative voltage value, such as –1V.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A voltage supply circuit, comprising:
   a positive charge pump stage configured to generate a positive voltage;
   a negative charge pump stage configured to generate a negative voltage;
   an oscillator configured to output a clock signal;
   a control stage configured to:
      receive a voltage representative of the negative voltage;
      compare the voltage representative of the negative voltage with a first reference voltage; and
      output a first control signal having a first state in response to the voltage representative of the negative voltage exceeding the first reference voltage; and
   a clock stage including a logical conjunction gate, the logical conjunction gate being configured to:
      receive the clock signal and the first control signal;
      in response to the first control signal having the first state, end an on-time duration of the clock signal to cause a slope of the positive voltage to decrease; and
      output the clock signal.

2. The voltage supply circuit of claim 1, wherein the clock signal drives the positive charge pump stage.

3. The voltage supply circuit of claim 1, wherein the logical conjunction gate is an AND gate clock having:
   a plurality of inputs including:
      a first input configured to receive the clock signal,
      a second input configured to receive the first control signal, and
      a third input configured to receive a second control signal having a logical state that is representative of whether the voltage representative of the negative voltage exceeds a second reference voltage; and
   an output configured to output the clock signal.

4. The voltage supply circuit of claim 1, comprising:
   a clock buffer having an input coupled to an output of the clock stage and an output coupled to the positive charge pump stage, wherein the clock buffer is configured to:
      receive the clock signal;
      buffer the clock signal;
      generate two complementary clock signals based on buffering the clock signal; and
      output the two complementary clock signals to the positive charge pump stage.

5. A system, comprising:
   a circuit configured to receive a positive voltage and a negative voltage; and
   a voltage supply circuit including:
      a positive charge pump stage configured to generate the positive voltage;
      a negative charge pump stage configured to generate the negative voltage;
      an oscillator configured to output a clock signal;
      a control stage configured to:
         receive a voltage representative of the negative voltage;
         compare the voltage representative of the negative voltage with a first reference voltage; and
         output a first control signal having a first state in response to the voltage representative of the negative voltage exceeding the first reference voltage; and
      a clock stage including a logical conjunction gate, the logical conjunction gate being configured to:
         receive the clock signal and the first control signal;
         in response to the first control signal having the first state, end an on-time duration of the clock signal to cause a slope of the positive voltage to decrease; and
         output the clock signal.

6. The system of claim 5, wherein the clock signal drives the positive charge pump stage.

7. The system of claim 5, wherein the logical conjunction gate is an AND gate clock having:
   a plurality of inputs including:
      a first input configured to receive the clock signal,
      a second input configured to receive the first control signal, and
      a third input configured to receive a second control signal having a logical state that is representative of whether the voltage representative of the negative voltage exceeds a second reference voltage; and
   an output configured to output the clock signal.

8. The system of claim 5, wherein the voltage supply circuit includes:
   a clock buffer having an input coupled to an output of the clock stage and an output coupled to the positive charge pump stage, wherein the clock buffer is configured to:
      receive the clock signal;
      buffer the clock signal;
      generate two complementary clock signals based on buffering the clock signal; and
      output the two complementary clock signals to the positive charge pump stage.

9. A method, comprising:
   generating, by a positive charge pump stage, a positive voltage;
   generating, by a negative charge pump stage, a negative voltage;
   outputting, by an oscillator, a clock signal to a clock stage including a logical conjunction gate;
   comparing, by a control stage, a voltage representative of the negative voltage with a first reference voltage;
   outputting, by the control stage, a first control signal having a first state in response to the voltage representative of the negative voltage exceeding the first reference voltage;
   receiving, by the logical conjunction gate, the clock signal and the first control signal;
   in response to the first control signal having the first state, ending, by the logical conjunction gate, an on-time duration of the clock signal to causing a slope of the positive voltage to decrease; and
   outputting, by the logical conjunction gate, the clock signal.

10. The method of claim 9, wherein the clock signal drives the positive charge pump stage.

11. The method of claim 9, wherein the logical conjunction gate is an AND gate clock having:
   a plurality of inputs including:
      a first input configured to receive the clock signal,
      a second input configured to receive the first control signal, and
      a third input configured to receive a second control signal having a logical state that is representative of whether the voltage representative of the negative voltage exceeds a second reference voltage; and
   an output configured to output the clock signal.

12. The method of claim 9, comprising:
   receiving, by a clock buffer having an input coupled to an output of the clock stage and an output coupled to the positive charge pump stage, the clock signal;

buffering, by the clock buffer, the clock signal;
generating, by the clock buffer, two complementary clock signals based on buffering the clock signal; and
outputting, by the clock buffer, the two complementary clock signals to the positive charge pump stage.

\* \* \* \* \*